US008971367B2

(12) United States Patent
Uchida et al.

(10) Patent No.: US 8,971,367 B2
(45) Date of Patent: Mar. 3, 2015

(54) SURFACE-EMITTING LASER, SURFACE-EMITTING LASER ARRAY, METHOD OF MANUFACTURING SURFACE-EMITTING LASER, METHOD OF MANUFACTURING SURFACE-EMITTING LASER ARRAY AND OPTICAL APPARATUS EQUIPPED WITH SURFACE-EMITTING LASER ARRAY

(75) Inventors: Tatsuro Uchida, Machida (JP); Takeshi Uchida, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/880,839

(22) PCT Filed: Nov. 2, 2011

(86) PCT No.: PCT/JP2011/075876
§ 371 (c)(1),
(2), (4) Date: Apr. 22, 2013

(87) PCT Pub. No.: WO2012/063884
PCT Pub. Date: May 18, 2012

(65) Prior Publication Data
US 2013/0223465 A1     Aug. 29, 2013

(30) Foreign Application Priority Data

Nov. 8, 2010   (JP) ................................. 2010-249402

(51) Int. Cl.
*H01S 5/00* (2006.01)
*H01S 5/227* (2006.01)
*H01S 5/183* (2006.01)
*H01S 5/20* (2006.01)
*H01S 5/065* (2006.01)
*H01S 5/42* (2006.01)

(52) U.S. Cl.
CPC ............ *H01S 5/227* (2013.01); *H01S 5/18391* (2013.01); *H01S 5/2081* (2013.01);
(Continued)

(58) Field of Classification Search
USPC ................... 372/43.01, 45.01, 45.012, 50.11
See application file for complete search history.

(56) References Cited

U.S. PATENT DOCUMENTS 7,466,738 B2   12/2008   Jikutani
7,807,485 B2   10/2010   Uchida et al.
(Continued)

FOREIGN PATENT DOCUMENTS

EP   2 149 945 A1   2/2010
EP   2 149 946 A2   2/2010
(Continued)

OTHER PUBLICATIONS

PCT International Search Report and Written Opinion of the International Searching Authority, International Application No. PCT/JP2011/075876, Mailing Date Feb. 23, 2012.

*Primary Examiner* — Dung Nguyen
(74) *Attorney, Agent, or Firm* — Fitzpatrick, Cella, Harper and Scinto

(57) ABSTRACT

A method of manufacturing a surface-emitting laser that allows precise alignment of the center position of a surface relief structure and that of a current confinement structure and formation of the relief structure by means of which a sufficient loss difference can be introduced between the fundamental transverse and higher order transverse mode. Removing the dielectric film on the semiconductor layers and the first-etch stop layer along the second pattern, using a second- and third-etch stop layer are conducted in single step after forming the confinement structure. The relief structure is formed by three layers including a lower, middle and upper layer, and total thickness of three layers is equal to the optical thickness of an odd multiple of ¼ wavelength ($\lambda$: oscillation wavelength, n: refractive index of the semiconductor layer). The layer right under the lower layer is the second-etch stop layer and the first-etch stop layer is laid right on this etch stop layer.

27 Claims, 12 Drawing Sheets

252

(52) U.S. Cl.
CPC .............. *H01S 5/209* (2013.01); *H01S 5/0653* (2013.01); *H01S 5/18313* (2013.01); *H01S 5/423* (2013.01); *H01S 2301/166* (2013.01); *H01S 2301/18* (2013.01)
USPC ................ 372/43.01; 372/45.01; 372/45.012; 372/50.11; 372/50.124

(56) References Cited

U.S. PATENT DOCUMENTS 8,377,727 B2 2/2013 Inao et al.
2008/0151961 A1 6/2008 Kim et al.
2011/0165712 A1 7/2011 Uchida
2012/0032143 A1 2/2012 Takeuchi et al.
2013/0044780 A1 2/2013 Inao et al.

FOREIGN PATENT DOCUMENTS

| | | |
|---|---|---|
| JP | 2001-284722 A | 10/2001 |
| JP | 2006-140446 A | 6/2006 |
| JP | 2010-56528 A | 3/2010 |
| WO | 2006/131316 A1 | 12/2006 |

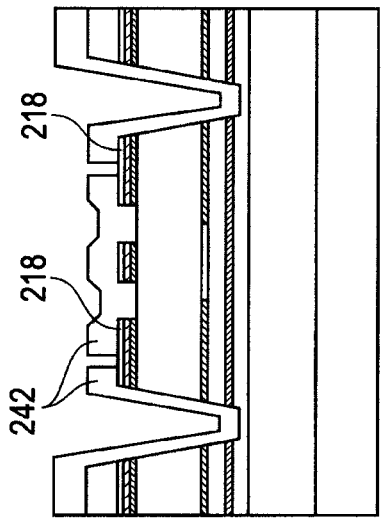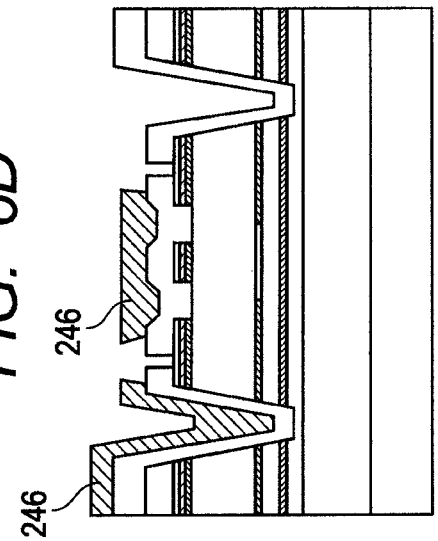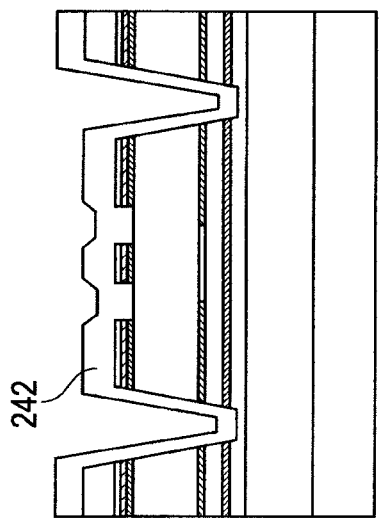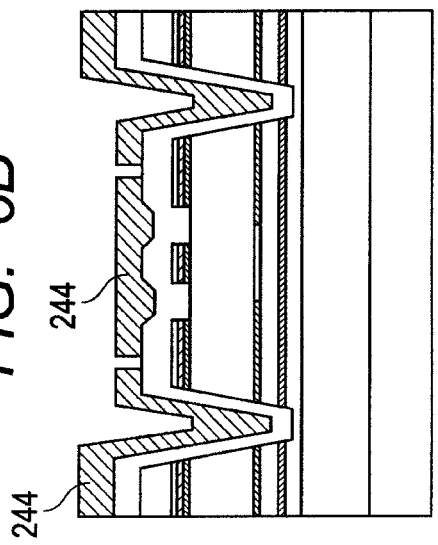

SURFACE-EMITTING LASER, SURFACE-EMITTING LASER ARRAY, METHOD OF MANUFACTURING SURFACE-EMITTING LASER, METHOD OF MANUFACTURING SURFACE-EMITTING LASER ARRAY AND OPTICAL APPARATUS EQUIPPED WITH SURFACE-EMITTING LASER ARRAY

TECHNICAL FIELD

The present invention relates to a surface-emitting laser, a surface-emitting laser array, a method of manufacturing a surface-emitting laser, a method of manufacturing a surface-emitting laser array and an optical apparatus equipped with a surface-emitting laser array.

BACKGROUND ART

Vertical cavity surface-emitting lasers (to be referred to as VCSEL hereinafter) are a known type of surface-emitting laser.

Such a surface-emitting laser has a pair of reflecting mirrors sandwiching an active region at the opposite sides thereof to form a resonator in a direction perpendicular to the substrate thereof and emits light in the direction perpendicular to the substrate.

The transverse mode output of such a surface-emitting laser is required to be a single mode output in view of applications thereof including electronic photography and telecommunications and hence developing a technique for controlling transverse mode of oscillation is an important problem.

For this reason, efforts are being paid to realize a single transverse mode in a surface-emitting laser by arranging a current confinement structure by way of selective oxidation in the inside of the device and thereby limit the light emission region of an active layer.

However, when realizing a single transverse mode only by arranging a current confinement structure, the confinement diameter needs to be reduced. As the confinement diameter is reduced, the light emission region is reduced to make it difficult to produce a large laser output.

In view of the above-identified problem, methods that can realize oscillations in a single transverse mode, while maintaining a relatively broad light emission region if compared with an instance of realizing a single transverse mode only by way of a current confinement structure, by intentionally introducing a loss difference between the fundamental transverse mode and higher order transverse mode, have been discussed.

As one of such methods, PTL 1 proposes a surface-emitting laser in which the reflectance distribution of a peripheral region surrounding the center region of the light emission region that corresponds to a light emission center region is made lower than that of the center region by forming a stepped structure by means of a semiconductor layer.

According to the PTL 1, the reflectance distribution of the peripheral region surrounding the center region becomes relatively lower than that of the center region by forming such a structure so that higher order transverse mode oscillations can be suppressed without reducing the optical output of the fundamental transverse mode.

A stepped structure as described above is referred to as surface relief structure hereinafter in this specification.

CITATION LIST

Patent Literature

PTL 1: Japanese Patent Application Laid-Open No. 2010-56528

SUMMARY OF INVENTION

Technical Problem

Meanwhile, when forming a surface relief structure, the depth of the surface relief structure, namely the step between the high reflectance surface and the low reflectance surface, is as important as horizontal alignment of the surface relief structure and the current confinement structure.

In other words, the surface relief structure and the non-oxidized region of the current confinement structure are precisely aligned in order to achieve a high efficiency for single mode oscillations in the fundamental transverse mode by increasing the reflection loss for higher order transverse mode and suppressing oscillations in higher order mode. At the same time, the step between the high reflectance surface and the low reflectance surface is desirably made equal to the optical thickness of an odd multiple of the ¼ wavelength (an odd multiple of λ/4n, λ: oscillation wavelength, n: refractive index of the semiconductor layer). If, for example, the center axis of the surface relief structure is displaced from that of the current confinement structure, an unintended loss is introduced into the mode where no oscillation takes place (e.g., the fundamental transverse mode). If the step between the high reflectance surface and the low reflectance surface differs from the optical thickness of an odd multiple of the ¼ wavelength, a sufficient loss difference cannot be introduced between the fundamental transverse mode and higher order transverse mode.

PTL 1 discloses a technique referred to as self alignment process that employs two dielectric layers and a single resist layer as mask in order to precisely align the center axis of the surface relief structure and that of the current confinement structure.

This technique provides a very useful manufacturing process from the viewpoint of achieving a precise alignment of the center axis of the surface relief structure and that of the current confinement structure.

However, there are instances where a higher precision level needs to be achieved from the viewpoint of controlling the depth of a surface relief structure.

More specifically, with the manufacturing technique disclosed in PTL 1, the bottom surface (the region where the low reflectance surface is exposed) of the surface relief structure that is formed in advance can be scraped when removing dielectric layers that are to be used to form a mask. Then, an optical thickness of an odd multiple of the ¼ wavelength that is the depth (step) capable of providing the largest loss difference cannot be produced on a stable basis.

In view of the above-identified problems, it is therefore an object of the present invention is to provide a surface-emitting laser that allows precise alignment of the center position of a surface relief structure and that of a current confinement structure and formation of a surface relief structure by means of which a sufficient loss difference can be introduced between the fundamental transverse mode and higher order transverse mode and also a method of manufacturing such a surface-emitting laser.

Another object of the present invention is to provide a method of manufacturing a surface-emitting laser array that employs the above method of manufacturing a surface-emitting laser, a surface-emitting laser array and an optical apparatus equipped with such a surface-emitting laser array.

Solution to Problem

A method of manufacturing a surface-emitting laser according to the present invention is the method of manufacturing a surface-emitting laser having a plurality of semiconductor layers including a lower reflecting mirror, an active layer and an upper reflecting mirror stacked on a substrate, a light emission portion of the upper reflecting mirror being provided with a surface relief structure formed by using a stepped structure for controlling the reflectance distribution, the surface-emitting laser being produced as a mesa structure, characterized by comprising: forming a first dielectric film on the semiconductor layers; forming a first pattern for defining the mesa structure and also forming a second pattern for defining the surface relief structure in the first dielectric film in the single step; removing the surface of the stacked semiconductor layers along the first and second patterns, using the first dielectric film having the first and second patterns formed therein as mask and also a first etch stop layer in the upper reflecting mirror, to form the first and second patterns on the surface of the semiconductor layers; forming a second dielectric film on the semiconductor layers including the first dielectric film having the first and second patterns formed therein; removing the second dielectric film formed on the semiconductor layers having the first pattern formed thereon; forming the mesa structure from a portion where the second dielectric film has been removed; forming a current confinement structure after the forming of the mesa structure; and removing the second dielectric film including the first dielectric film on the semiconductor layers and also removing the first etch stop layer to be conducted along the second pattern in the single step, using the semiconductor layer arranged right under the first etch stop layer as second etch stop layer, after the forming of the current confinement structure.

A surface-emitting laser according to the present invention is a surface-emitting laser having a plurality of semiconductor layers including a lower reflecting mirror, an active layer and an upper reflecting mirror stacked on a substrate, a light emission portion of the upper reflecting mirror being provided with a surface relief structure formed by using a stepped structure for controlling the reflectance distribution, characterized in that the surface relief structure is formed by three layers including a lower layer, a middle layer and an upper layer, and a total thickness of the lower layer, the middle layer and the upper layer is made equal to an optical thickness of an odd multiple of ¼ wavelength (an odd multiple of λ/4n, λ: oscillation wavelength, n: refractive index of the semiconductor).

A surface-emitting laser array according to the present invention is a surface-emitting laser array, characterized in that the above surface-emitting lasers are arranged in array.

An optical apparatus according to the present invention is an optical apparatus, characterized by comprising the above surface-emitting laser array as light source.

Advantageous Effects of Invention

Thus, the present invention provides a surface-emitting laser that allows precise alignment of the center position of a surface relief structure and that of a current confinement structure and formation of a surface relief structure by means of which a sufficient loss difference can be introduced between the fundamental transverse mode and higher order transverse mode and also a method of manufacturing such a surface-emitting laser.

Additionally, the present invention provides a method of manufacturing a surface-emitting laser array that employs the above method of manufacturing a surface-emitting laser, a surface-emitting laser array and an optical apparatus equipped with such a surface-emitting laser array.

Further features of the present invention will become apparent from the following description of exemplary embodiments with reference to the attached drawings.

BRIEF DESCRIPTION OF DRAWINGS

FIG. 6A is still another schematic illustration of the method of manufacturing the vertical cavity surface-emitting laser according to the first embodiment of the present invention.

FIG. 6B is still another schematic illustration of the method of manufacturing the vertical cavity surface-emitting laser according to the first embodiment of the present invention.

FIG. 6C is still another schematic illustration of the method of manufacturing the vertical cavity surface-emitting laser according to the first embodiment of the present invention.

FIG. 6D is still another schematic illustration of the method of manufacturing the vertical cavity surface-emitting laser according to the first embodiment of the present invention.

DESCRIPTION OF EMBODIMENTS

Preferred embodiments of the present invention will now be described in detail in accordance with the accompanying drawings.

Unlike any known arrangement, the present invention adopts the following arrangement of using three etch stop layers when forming a surface relief structure by means of a stepped structure provided at the light emission portion of the upper reflecting mirror in order to control the reflectance distribution.

Namely, an operation of removing the dielectric film on the semiconductor layers and that of removing the first etch stop layer along the second pattern are conducted in a single step by using a second etch stop layer and a third etch stop layer after the step of forming a current confinement structure.

Additionally, the surface relief structure is formed by three layers including a lower layer, a middle layer and an upper layer, and a total thickness of the lower layer, the middle layer and the upper layer is made equal to an optical thickness of an odd multiple of ¼ wavelength (an odd multiple of λ/4n, λ: oscillation wavelength, n: refractive index of the semiconductor layer).

Furthermore, the second etch stop layer is arranged right under the lower layer and the first etch stop layer is laid right on the second etch stop layer.

With the above arrangement, the step (depth) of the surface relief structure can be formed to an optical thickness of an add multiple of the ¼ wavelength on a stable basis.

Thus, the present invention can also provide a method of manufacturing a surface-emitting laser having a surface relief structure as described below by using three etch stop layers as described above.

Namely, the present invention can provide a method of manufacturing a surface-emitting laser having a surface relief structure whose center position is aligned with the center position of the current confinement structure so that the largest loss difference can be introduced between the fundamental transverse mode and higher order transverse mode. Thus, the present invention can provide a method of manufacturing a surface-emitting laser array by arranging a plurality of surface-emitting lasers manufactured by the above-described method of manufacturing a surface-emitting laser.

With the above-described arrangement, the center position of the surface relief structure and that of the current confinement structure can be aligned highly precisely.

Additionally, damages to the surface can be minimized in the process of manufacturing and a surface relief structure having a depth (step) corresponding to the optical length of an odd multiple of the ¼ wavelength can highly precisely be formed.

EMBODIMENTS

Now, embodiments of the present invention will be described.

First Embodiment

A method of manufacturing a vertical cavity surface-emitting laser having a convex surface relief structure will be described below for the first embodiment.

Figure 1A:
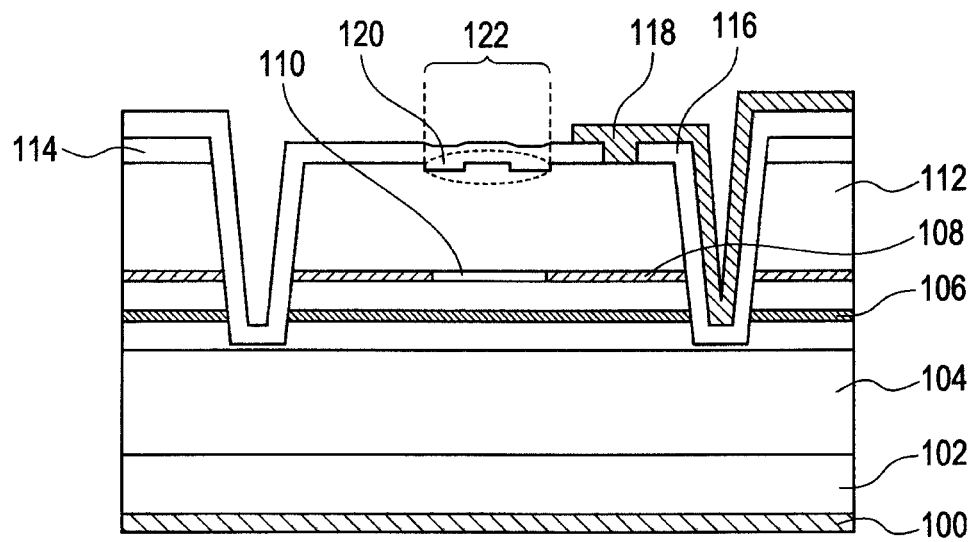
FIG. 1A is a schematic illustration of the configuration of the vertical cavity surface-emitting laser according to a first embodiment of the present invention.
Figure 1B:
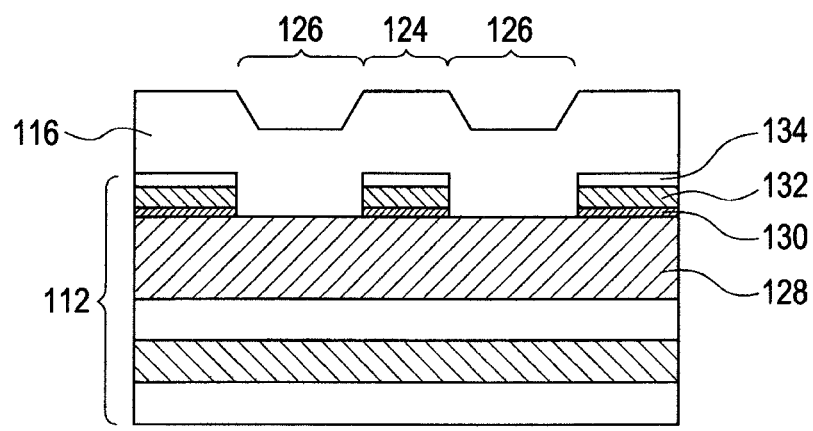
FIG. 1B is another schematic illustration of the configuration of the vertical cavity surface-emitting laser according to the first embodiment of the present invention.

FIGS. 1A and 1B schematically illustrate the configuration of the vertical cavity surface-emitting laser according to the first embodiment of the present invention.

FIG. 1A is a schematic cross-sectional view of the surface-emitting laser of the first embodiment. In FIG. 1A, 100 is an n-side electrode, 102 is a substrate, 104 is a lower distributed Bragg reflector (DBR) mirror (multilayer film reflecting mirror), 106 is an active layer, 108 is a current confining section (oxidized region) and 110 is a non-oxidized.

Additionally, in FIG. 1A, 112 is an upper DBR mirror (multilayer film reflecting mirror), 114 is a dielectric layer, 116 is an insulating film, 118 is a p-side electrode (pad electrode), 120 is a surface relief structure and 122 is a light emission region.

FIG. 1B is a schematic enlarged view of the light emission region 122 and a peripheral area thereof. In FIG. 1B, 124 is a high reflectance region and 126 is a low reflectance region.

The layers of the region forming a surface relief structure include a p-type $Al_{0.5}Ga_{0.5}As$ layer 128, a p-type AlGaInP etch stop layer 130, a p-type $Al_{0.5}Ga_{0.5}As$ layer 132 and a p-type GaAs contact layer 134 which form the surface of the upper DBR mirror 112.

In order to make the surface-emitting laser operate most efficiently in a single transverse mode, the total thickness of the following three layers is desirably made equal to the optical thickness of an add multiple of the ¼ wavelength (an odd multiple of $\lambda/4n$, $\lambda$: oscillation wavelength, n: refractive index of the semiconductor layer). Namely, the total thickness of the three layers including the p-type AlGaInP etch stop layer 130, the p-type $Al_{0.5}Ga_{0.5}As$ layer 132 and the p-type GaAs contact layer 134 is desirably made equal to the above optical thickness.

In the vertical cavity surface-emitting laser of this embodiment, the surface relief structure and the non-oxidized region (light emission region) of the current confinement structure are so arranged that their center axes agree with each other.

Particularly, when the diameter of the non-oxidized region 110 is not greater than 7 microns, a high output and single transverse mode oscillations can be realized by making the diameter of the high reflectance region 124 in the surface relief structure 120 to be between a half and ¾ of the diameter of the non-oxidized region.

In this way, the center axis of the surface relief structure and that of the non-oxidized region (light emission region) of the current confinement structure are aligned, and the diameter of the non-oxidized region and that of the high reflectance region 124 in the surface relief structure are made to show an appropriate relationship.

Then, as a result, emission of light in higher order mode can be suppressed without damaging the fundamental mode, and a high output and single transverse mode oscillations by the fundamental mode can be realized.

Now, the method of manufacturing the surface-emitting laser of this embodiment will be described below.

FIGS. 2A to 2B, 3A to 3D, 4A to 4D, 5A to 5D, 6A to 6D, and 7A to 7C schematically illustrate the method of manufacturing the vertical cavity surface-emitting laser of this embodiment.

Figure 2A:
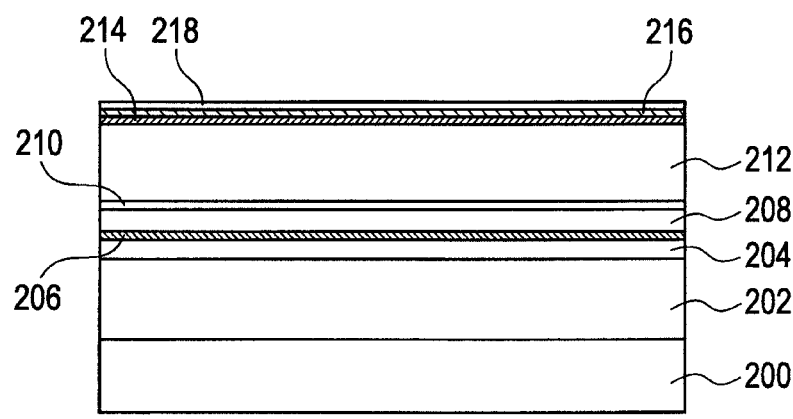
FIG. 2A is a schematic illustration of the method of manufacturing the vertical cavity surface-emitting laser according to the first embodiment of the present invention.

As illustrated in FIG. 2A, an n-type $AlAs/Al_{0.5}Ga_{0.5}As$ multilayer film (lower DBR mirror) 202 is made to grow on an n-type GaAs substrate 200 by way of a buffer layer (not illustrated) by means of an MOCVD crystal growth technique.

Then, an n-type AlGaInP spacer layer 204 and a GaInP/AlGaInP-MQW active layer 206 are sequentially made to grow further thereon.

Additionally, a p-type AlGaInP spacer layer 208 and a p-type $Al_{0.98}Ga_{0.02}As$ selectively oxidized layer 210 are made to grow on the active layer 206.

Furthermore, a p-type $Al_{0.9}Ga_{0.1}As/Al_{0.5}Ga_{0.5}As$ multilayer film 212 is made to grow thereon.

Subsequently, a p-type AlGaInP etch stop layer 214, a p-type $Al_{0.5}Ga_{0.5}As$ layer 216 and a p-type GaAs contact layer 218 are sequentially made to grow to produce a DBR mirror layer.

Figure 2B:
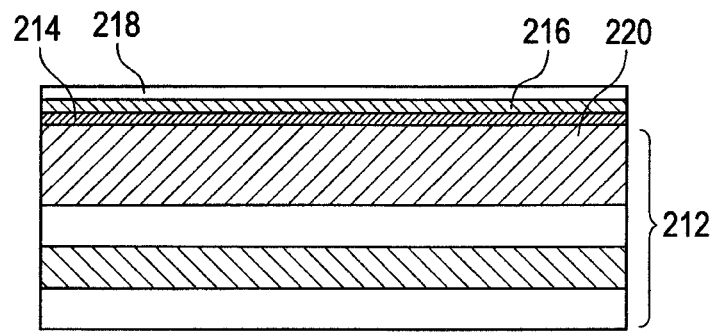
FIG. 2B is another schematic illustration of the method of manufacturing the vertical cavity surface-emitting laser according to the first embodiment of the present invention.

As illustrated in FIG. 2B, the region that forms the surface relief structure is constituted by a p-type $Al_{0.5}Ga_{0.05}As$ layer 220 (the top layer of p-type $Al_{0.9}Ga_{0.1}As/Al_{0.5}Ga_{0.5}As$ multilayer film 212) having an optical thickness that is N times of the ½ wavelength (N times of $\lambda/2n$, N: a natural number not smaller than 1, $\lambda$: oscillation wavelength, n: refractive index of the semiconductor layer), a p-type AlGaInP etch stop layer 214, a p-type $Al_{0.5}Ga_{0.5}As$ layer 216 and a p-type GaAs contact layer 218.

Note that the total thickness of the three layers including the p-type AlGaInP etch stop layer 214, the p-type $Al_{0.5}Ga_{0.5}As$ layer 216 and the p-type GaAs contact layer 218 is desirably made equal to the optical thickness of an odd multiple of the ¼ wavelength (an odd multiple of $\lambda/4n$, $\lambda$: oscillation wavelength, n: refractive index of the semiconductor layer).

For example, the total thickness of the three layers is made equal to the optical thickness of an odd multiple of the ¼ wavelength when p-type AlGaInP etch stop layer 214 is made to be 10 nm thick and the p-type GaAs contact layer 218 is made to be 20 nm thick and the thickness of the p-type $Al_{0.5}Ga_{0.5}As$ layer 216 is appropriately balanced.

Thus, in this way, a plurality of semiconductor layers including a lower reflecting mirror, an active layer, a selectively oxidized layer (current confinement layer), an upper reflecting mirror and a contact layer are sequentially made to grown on the substrate.

Figure 3A:
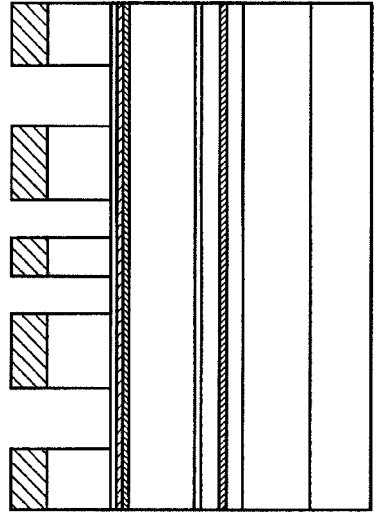
FIG. 3A is still another schematic illustration of the method of manufacturing the vertical cavity surface-emitting laser according to the first embodiment of the present invention.

Then, as illustrated in FIG. 3A, a first dielectric film 222 is formed on the stacked semiconductor layers.

For instance, the material of the first dielectric film 222 can be selected from any of silicon oxide, silicon nitride and silicon oxynitride.

Figure 3C:
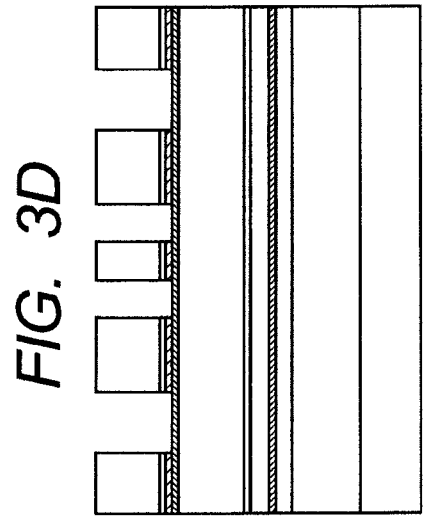
FIG. 3C is still another schematic illustration of the method of manufacturing the vertical cavity surface-emitting laser according to the first embodiment of the present invention.
Figure 3B:
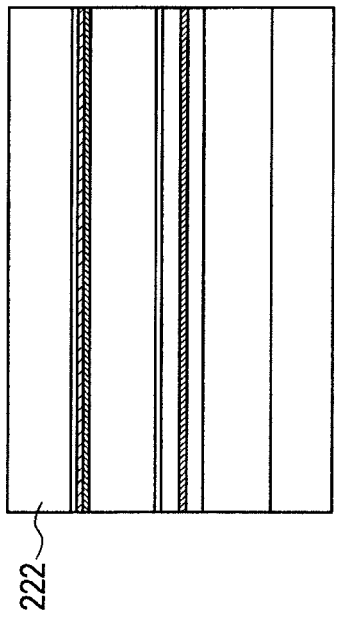
FIG. 3B is still another schematic illustration of the method of manufacturing the vertical cavity surface-emitting laser according to the first embodiment of the present invention.

Subsequently, a first resist pattern 224 is formed on the first dielectric film 222 by means of a lithography technique (FIG. 3B).

Figure 8A:
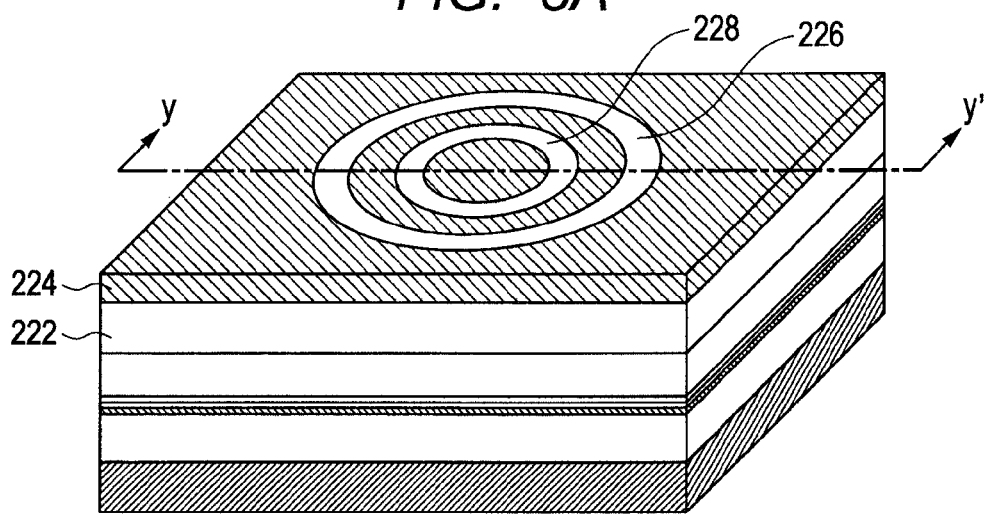
FIG. 8A is a schematic illustration of a first resist film formed by the method of manufacturing the vertical cavity surface-emitting laser according to the first embodiment of the present invention.
Figure 8B:
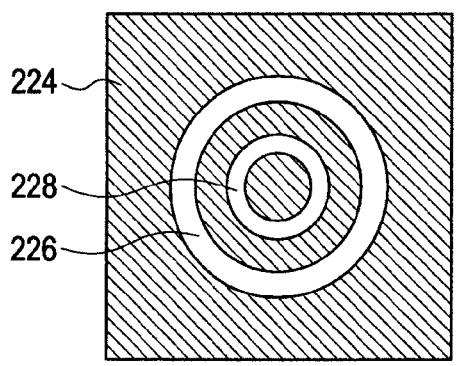
FIG. 8B is another schematic illustration of the first resist film formed by the method of manufacturing the vertical cavity surface-emitting laser according to the first embodiment of the present invention.
Figure 8C:
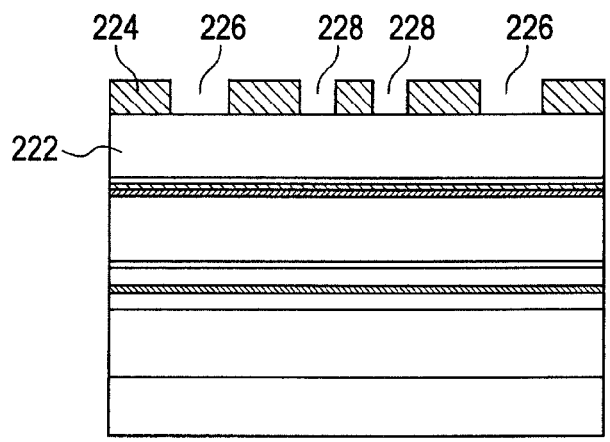
FIG. 8C is still another schematic illustration of the first resist film formed by the method of manufacturing the vertical cavity surface-emitting laser according to the first embodiment of the present invention.

FIGS. 8A to 8C schematically illustrate the first resist film 224 formed in the above-described manner.

FIG. 8A is a schematic perspective view of the surface-emitting laser, FIG. 8B is a schematic plan view of the surface-emitting laser and FIG. 8C is a schematic cross-sectional view of the surface-emitting laser taken along ling y-y' in the schematic perspective view of FIG. 8A.

As illustrated in FIGS. 8A to 8C, two annular aperture patterns (of large and small annular) having the same center axis in common (the first pattern 226 and the second pattern 228) are formed in the first resist film 224 on the first dielectric film 222.

While two different patterns including a large diameter circular annular pattern and a small diameter circular pattern having the same center axis in common are concentrically formed in the arrangement of FIGS. 8A to 8C, it should be noted that the present invention is by no means limited to such an arrangement.

For example, the annular patterns may be replaced by a larger square-shaped annular pattern and a smaller square-shaped annular pattern whose center axes are made to agree with each other.

Since the first and second patterns are formed on the first dielectric film 222 at the same time by means of a lithography technique, the relative positional relationship between the first pattern and the second pattern is defined at that time.

The surface relief structure (stepped structure) is defined by the small diameter circular aperture pattern (the second pattern 228) and the diameter of the mesa structure is determined by the large diameter circular annular aperture pattern (the first pattern 226).

Then, as a result, the positional relationship between the oxidized confinement structure and the surface relief structure (stepped structure) can be defined highly precisely.

Subsequently, as illustrated in FIG. 3C, the first resist pattern 224 is transferred on the first dielectric film 222 by wet etching using buffered hydrofluoric acid (BHF).

Note that the transfer operation may be conducted not by means of wet etching but by means of dry etching.

At this time, the first resist pattern is transferred on the first dielectric film 222 such that the first pattern and the second pattern that are a large diameter annular aperture pattern and a small diameter annular aperture pattern having the same center axis in common are produced.

The first resist pattern 224 is removed after the wet etching using buffered hydrofluoric acid.

Then, the first and second patterns are formed on the surface of the semiconductor layers by using the first dielectric film where the first and second patterns are formed as mask and also the first etch stop layer in the upper reflecting mirror.

An alloy composed of Al, Ga, In and P or an alloy composed of Ga, In and P can be used for the first etch stop layer.

Figure 3D:
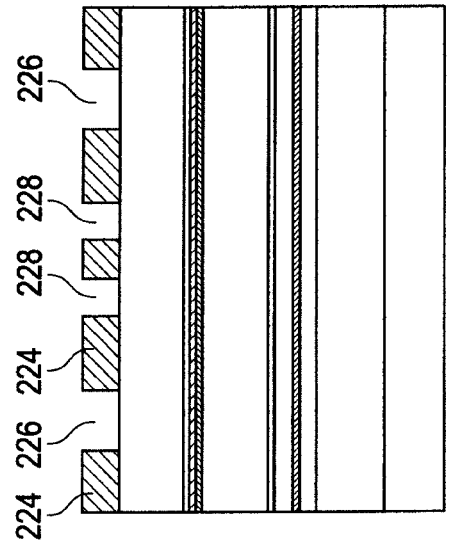
FIG. 3D is still another schematic illustration of the method of manufacturing the vertical cavity surface-emitting laser according to the first embodiment of the present invention.

More specifically, as illustrated in FIG. 3D, after removing the first resist pattern 224, the first and second patterns are transferred by using the first dielectric film 222 having the first pattern 226 and the second pattern 228 as mask in a manner as described below.

A 10 nm-thick p-type AlGaInP etch stop layer (the first etch stop layer) 214 (for example $(Al_xGa)In_yP$, x=0.5, y=0.5) may typically be employed.

Then, the patterns are transferred on the p-type GaAs contact layer 218/p-type $Al_{0.5}Ga_{0.5}As$ layer 216 by wet etching using a phosphoric acid-based etchant.

A phosphoric acid-based etchant has etching rate of the first etch stop layer is more than ten times faster than the etching rate of the p-type GaAs contact layer 218 and the p-type $Al_{0.5}Ga_{0.5}As$ layer 216 (etching selectivity is 10 or higher).

Note that, while wet etching is preferably employed in view of the possible damage to the surface, dry etching may alternatively be employed.

Figure 4A:
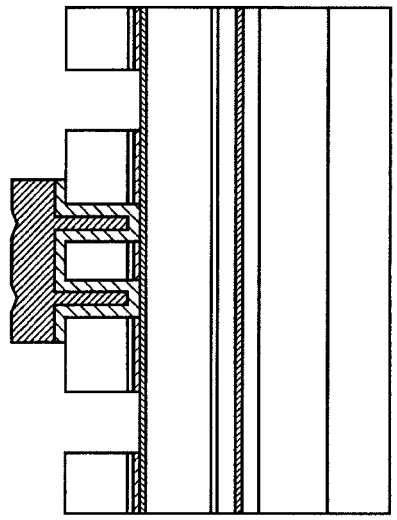
FIG. 4A is still another schematic illustration of the method of manufacturing the vertical cavity surface-emitting laser according to the first embodiment of the present invention.

Then, as illustrated in FIG. 4A, a second dielectric film 230 is formed on the stacked semiconductor layers including the first dielectric film 222 where the first pattern 226 and the second pattern 228 are formed by means of a CVD technique.

The second dielectric film 230 that is formed to a thickness of 230 nm, for example, is a layer for protecting the surface relief structure.

The second dielectric film 230 may typically be a silicon oxide film, a silicon nitride film or a silicon oxynitride film.

Figure 5A:
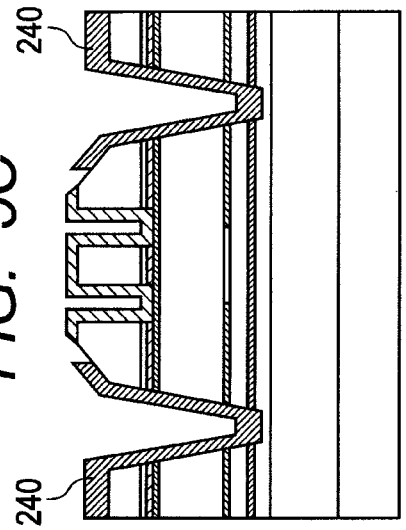
FIG. 5A is still another schematic illustration of the method of manufacturing the vertical cavity surface-emitting laser according to the first embodiment of the present invention.

Since the surface relief structure is protected by the second dielectric film 230 in this embodiment as described above, the possible damage to the surface of the surface relief structure can be alleviated if an oxygen plasma asking operation is conducted to remove the resist in a subsequent step (FIG. 5A).

Meanwhile, the second dielectric film 230 is formed to cover the first pattern 226 formed in the first dielectric film 222 in this step to consequently undesirably modify the profile of the pattern defined by photolithography.

However, because the second dielectric film 230 is typically formed by means of a plasma CVD technique, the second dielectric film 230 is formed on the sidewalls of the first pattern 226 formed in the first dielectric film 222 with a uniform film thickness.

Therefore, while the width of the first pattern 226 for defining the mesa structure may be narrowed, practically no trouble will occur in the dry etching operation for forming a mesa structure in a subsequent step (FIG. 4D) because the second dielectric film 230 having a uniform film thickness is formed in an isotropic manner.

Figure 4B:
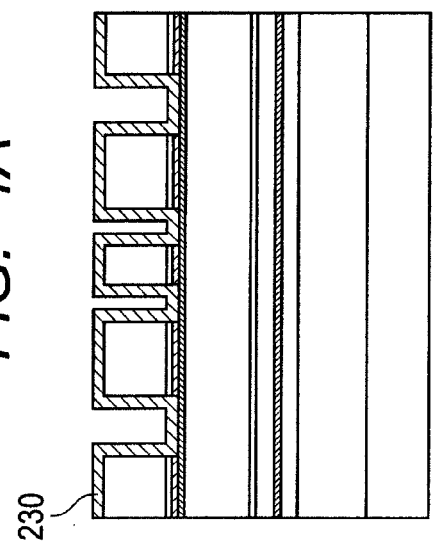
FIG. 4B is still another schematic illustration of the method of manufacturing the vertical cavity surface-emitting laser according to the first embodiment of the present invention.

Then, a second resist pattern 232 is formed by means of a lithography technique as illustrated in FIG. 4B. At this time, the second resist pattern 232 is formed so as to cover the second pattern 228 having the second dielectric film 230.

Figure 4C:
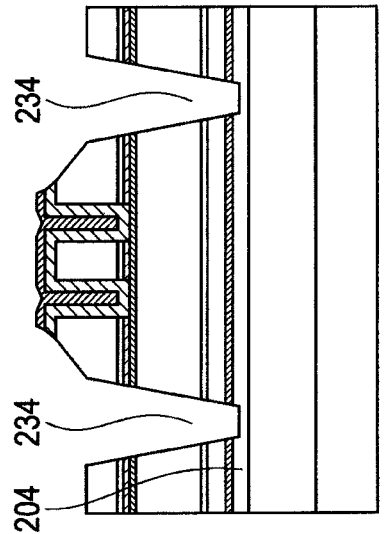
FIG. 4C is still another schematic illustration of the method of manufacturing the vertical cavity surface-emitting laser according to the first embodiment of the present invention.

Thereafter, as illustrated in FIG. 4C, the second dielectric film 230 is partly removed by using the second resist pattern 232 as mask and by means of wet etching, using buffered hydrofluoric acid.

The second dielectric film 230 is a layer for protecting the surface relief structure and hence the second dielectric film 230 is desirably formed with a film thickness smaller than the film thickness of the first dielectric film 222.

If the second dielectric film 230 is formed with a thick film thickness, the etching operation for partly removing the second dielectric film 230 will take time to increase the extent of side etching relative to the first dielectric film 222 so that the initial design values can undesirably be modified.

Figure 4D:
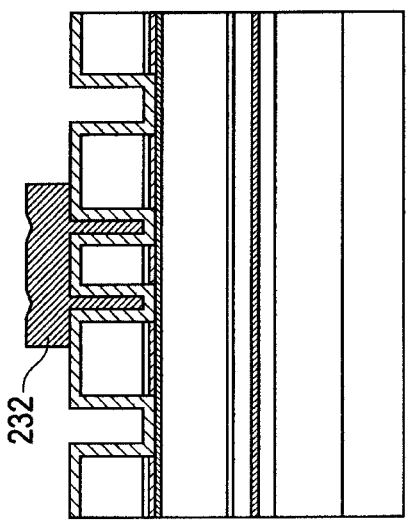
FIG. 4D is still another schematic illustration of the method of manufacturing the vertical cavity surface-emitting laser according to the first embodiment of the present invention.

Then, a post is formed for the mesa structure by forming a trench 234 by means of dry etching so as to expose the n-type AlGaInP spacer layer 204 (but not to expose the lower DBR mirror layer 202) as illustrated in FIG. 4D. Note that the second resist pattern 232 formed in the second pattern 228 for defining the surface relief desirably remains after the dry etching operation.

If the resist is gone, the second dielectric film 230 is removed during the dry etching operation. Then, consequently the surface relief structure that is formed prior to the dry etching operation can be damaged.

Note that the dry etching operation is conducted until the n-type AlGaInP spacer layer 204 is exposed in the instance of FIG. 4D.

However, the dry etching operation is required only to completely expose the sidewalls of the p-type $Al_{0.98}Ga_{0.02}As$ selectively oxidized layer 210 for forming the current confinement structure and hence the dry etching operation is not required to expose the n-type AlGaInP spacer layer 204.

Then, the second resist pattern 232 is removed by means of an oxygen plasma asking technique as illustrated in FIG. 5A.

Since the surface relief structure is protected by the second dielectric film 230, any damage to the surface of the surface relief structure can be prevented from taking place.

Figure 5C:
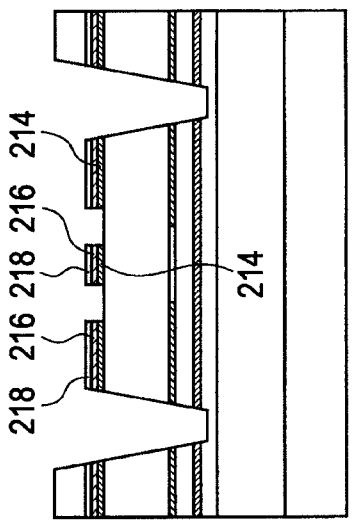
FIG. 5C is still another schematic illustration of the method of manufacturing the vertical cavity surface-emitting laser according to the first embodiment of the present invention.
Figure 5B:
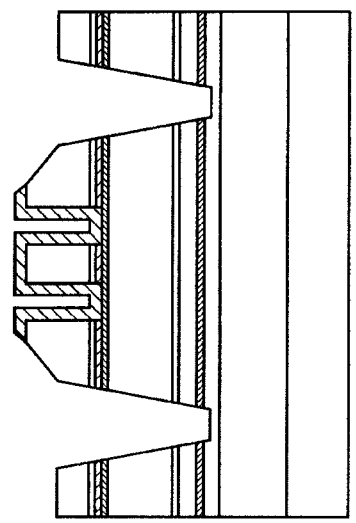
FIG. 5B is still another schematic illustration of the method of manufacturing the vertical cavity surface-emitting laser according to the first embodiment of the present invention.

Subsequently, as illustrated in FIG. 5B, the p-type $Al_{0.98}Ga_{0.02}As$ selectively oxidized layer 210 is selectively oxidized in a steam atmosphere at 450° C. substrate temperature, for example, to form a current confinement structure (oxidized region 236, non-oxidized region 238).

Since the surface of the stacked semiconductor layers except the trench 234 is covered with the first dielectric film 222 or the second dielectric film 230, the surface of the stacked semiconductor layers can be protected against the oxidation step.

Thus, the electrodes to be formed in a subsequent step (FIGS. 6A to 6D) can be formed to show an excellent contact resistance.

Thereafter, the second dielectric film is removed by using the semiconductor layer arranged right under the first etch stop layer as the second etch stop layer and the first etch stop layer is removed along the second pattern in the single step.

Figure 5D:
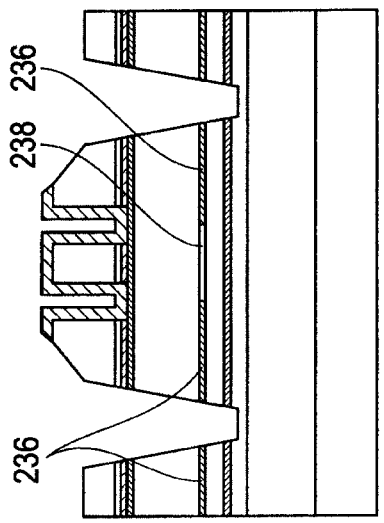
FIG. 5D is still another schematic illustration of the method of manufacturing the vertical cavity surface-emitting laser according to the first embodiment of the present invention.

More specifically, as illustrated in FIG. 5C, a third resist pattern 240 is formed so as to expose the first dielectric film 222 and the second dielectric film 230 at the top of the mesa. Then, as illustrated in FIG. 5D, the second dielectric film 230 including the first dielectric film 222 is removed by means of wet etching while the first etch stop layer is removed along the second pattern, and the pattern is transferred on the first etch stop layer.

Figure 9A:
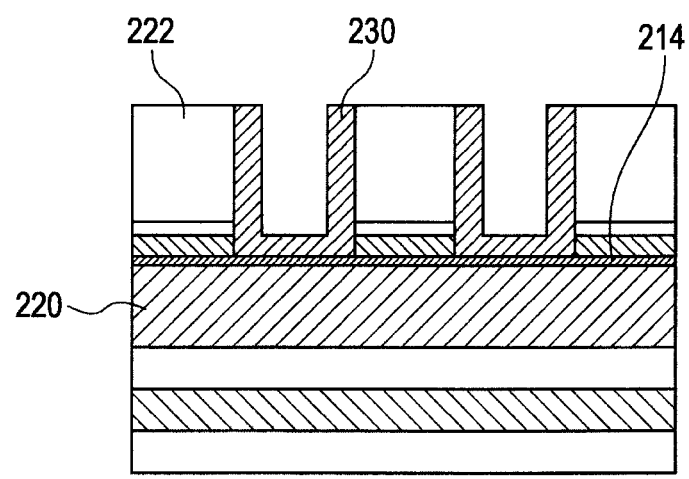
FIG. 9A is a schematic illustration of a surface relief structure formed by the method of manufacturing the vertical cavity surface-emitting laser according to the first embodiment of the present invention.
Figure 9B:
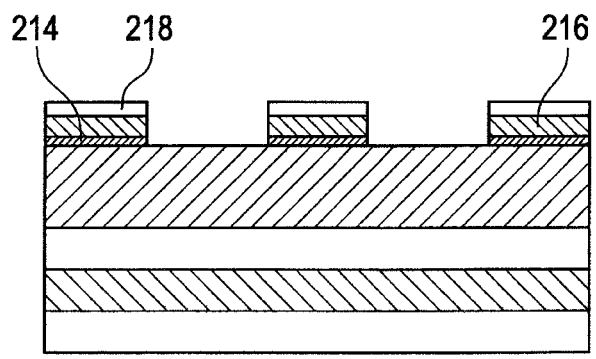
FIG. 9B is another schematic illustration of the surface relief structure formed by the method of manufacturing the vertical cavity surface-emitting laser according to the first embodiment of the present invention.

FIG. 9A illustrates the layers before the wet etching operation and FIG. 9B illustrates the layers after the wet etching operation.

As seen from FIGS. 9A and 9B, the pattern is transferred in a manner as described below by using the three layers of the first dielectric film 222, the p-type GaAs contact layer 218 and the p-type $Al_{0.5}Ga_{0.5}As$ layer 216 as mask.

Namely, the p-type $Al_{0.5}Ga_{0.5}As$ layer 220 is made to operate as etch stop layer (the second etch stop layer) when using the above three layers as mask.

Then, the pattern is transferred on the p-type AlGaInP etch stop layer (the first etch stop layer) 214 (for example, $(Al_xGa)In_yP$, x=0.5, y=0.5) by using the second etch stop layer.

The second etch stop layer may be made of a alloy composed of Al, Ga and As, where the composition ratio of Al is not greater than 75%.

When transferring the pattern on the first etch stop layer, the p-type GaAs contact layer arranged right under the first dielectric film 222 may be used as etch stop layer (the third etch stop layer).

The first etch stop layer, the second etch stop layer and the third etch stop layer may be formed by using respective materials that are of the same conductivity type.

Buffered hydrofluoric acid as etchant has etching rate of the p-type $Al_{0.5}Ga_{0.5}As$ layer 220 is more than ten times faster than the p-type AlGaInP etch stop layer 214 (etching selectivity is 10 or higher). Buffered hydrofluoric acid contains hydrofluoric acid and ammonium fluoride.

As a result of this step, the p-type AlGaInP etch stop layer 214 is etched in addition to the p-type GaAs contact layer 218 and the p-type $Al_{0.5}Ga_{0.5}As$ layer 216. Then, a surface relief structure (a stepped structure having an optical thickness (depth) of an odd multiple of the ¼ wavelength) is produced.

Then, as illustrated in FIG. 6A, an insulating film 242 is formed by means of a CVD film forming technique so as to cover the entire device.

For example, any of silicon oxide, silicon nitride and silicon oxynitride may be used as material for the insulating film 242.

If the film thickness of the insulating film 242 is d, the reflectance of the high reflectance region and that of the low reflectance region that are formed as surface relief structure are not altered when the insulating film is formed so as to satisfy the relationship of $$d=(N\lambda)/2n_d,$$

where $\lambda$ is the oscillation wavelength, $n_d$ is the refractive index of the second dielectric film and N is a natural number not smaller than 1.

Then, as illustrated in FIG. 6B, a fourth resist pattern 244 is formed by means of a lithography technique.

Thereafter, as illustrated in FIG. 6C, the insulating film 242 is removed by means of wet etching using buffered hydrofluoric acid to partly expose the contact layer 218.

Subsequently, in the step illustrated in FIG. 6D, a fifth resist pattern 246 is formed so as to cover a light emission port section and expose the contact layer.

Figure 7C:
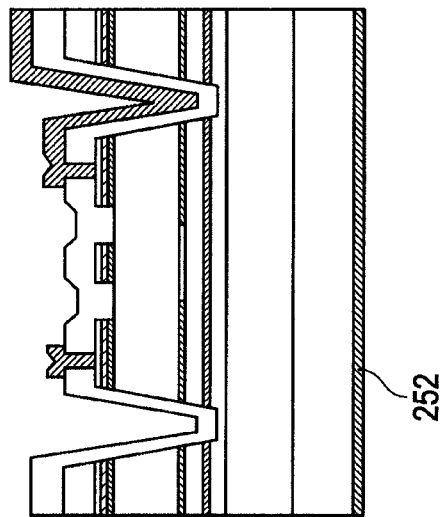
FIG. 7C is a further schematic illustration of the method of manufacturing the vertical cavity surface-emitting laser according to the first embodiment of the present invention.
Figure 7A:
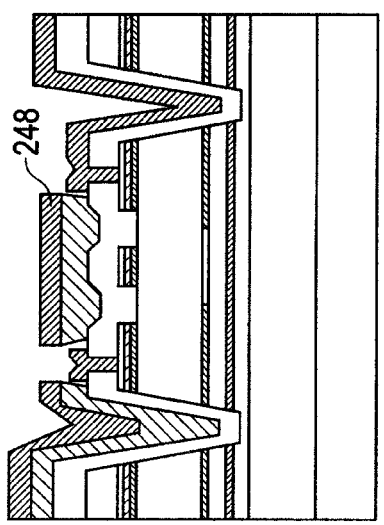
FIG. 7A is still another schematic illustration of the method of manufacturing the vertical cavity surface-emitting laser according to the first embodiment of the present invention.

Then, as illustrated in FIG. 7A, a metal film 248 made of Ti/Au is formed on the surface by evaporation, by means of a metal evaporation technique.

Figure 7B:
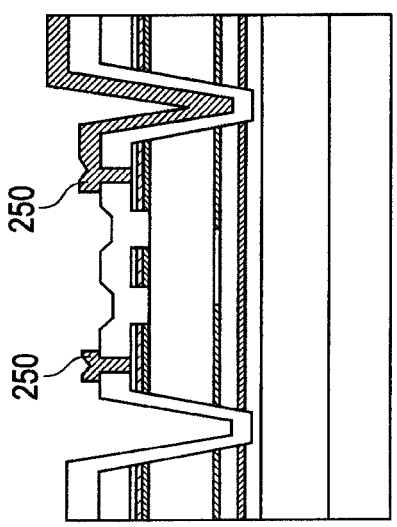
FIG. 7B is still another schematic illustration of the method of manufacturing the vertical cavity surface-emitting laser according to the first embodiment of the present invention.

Thereafter, in the step illustrated in FIG. 7B, a pad electrode 250 is formed to open the light emission port by means of a lift off technique.

Finally, in the step illustrated in FIG. 7C, an n-side electrode (AuGe/Ni/Au) 252 is formed on the rear surface of the n-type GaAs substrate by means of a metal evaporation technique.

With the above-described steps of this embodiment, two aperture patterns having the same center axis in common but different profiles (a large diameter circular annular aperture pattern and a small diameter circular aperture pattern) are formed by means of a photolithography technique at a high positional precision level. Then, a surface relief structure where the reflectance distribution is controlled is defined by the small diameter circular aperture pattern and the outer diameter of a mesa structure is defined by the large diameter circular annular aperture pattern so as to define a non-oxidized region of a current confinement structure.

Therefore, the center axis of the surface relief structure and the center axis of the non-oxidized region of the current confinement structure can be highly precisely controlled.

When the mesa structure is formed by using the large diameter circular annular aperture pattern by means of dry etching, the surface relief structure formed by the small diameter circular aperture pattern is protected by a dielectric film and resist so that the surface relief structure is not exposed to the outside.

A pattern transfer operation is conducted on the p-type AlGaInP etch stop layer when removing the first and second dielectric layers after forming the current confinement structure.

As described above, the GaAs contact layer 218 and the p-type $Al_{0.5}Ga_{0.5}As$ layer 220 (the layer under the p-type AlGaInP layer) can be made to operate as etch stop layer at this time.

Then, as a result, a surface relief structure having a step with an optical thickness of an odd multiple of the ¼ wavelength (an odd multiple of $\lambda/4n$, $\lambda$: oscillation wavelength, n: refractive index of the semiconductor layer) that is equal to the total thickness of the three layers (the GaAs contact layer, the p-type $Al_{0.5}Ga_{0.5}As$ layer (the layer sandwiched between the GaAs contact layer and the p-type AlGaInP layer) and the p-type AlGaInP layer) can highly precisely be formed.

While $(Al_xGa)In_yP$, x=0.5, y=0.5 is employed for the p-type AlGaInP etch stop layer in this embodiment, the present invention is by no means limited to the above composition ratio so long as the above-described etching selectivity is satisfied.

For example, a p-type $Ga_zInP$ (z=0.5) layer may alternatively be employed.

While a surface-emitting laser having a current confinement structure formed by selective oxidation is described for this embodiment, the present invention is by no means limited thereto.

Alternatively, for example, the above-described exposed second dielectric film of the first pattern and the first dielectric film that is a lower layer relative to the second dielectric film may be removed in a dielectric film removing step. Then, an operation of proton/ion injection may be conducted by way of the first pattern in an insulating region forming step after the above dielectric film removing step to produce an insulating region on the semiconductor layer and then to produce a current confinement structure.

While three layers including a p-type AlGaInP etch stop layer 128, a p-type $Al_{0.5}Ga_{0.5}As$ layer 130 and a p-type GaAs contact layer 132 are employed to form a surface relief structure in this embodiment, the present invention is by no means limited thereto.

For example, a combination of two layers including an etch stop layer and a contact layer may alternatively be employed so long as the total thickness of the layers of the surface relief structure is equal to the optical thickness of an odd multiple of the ¼ wavelength (an odd multiple of λ/4n, λ: oscillation wavelength, n: refractive index of the semiconductor layer).

While this embodiment is described in terms of a 680 nm band surface-emitting laser, the present invention is by no means limited thereto, and the present invention is equally applicable to, for example, 850 nm band (GaAs/AlGaAs active layer-based) surface-emitting lasers.

Additionally, the present invention is by no means limited to the above-described techniques (systems) including techniques (systems) used for a MOCVD crystal growth technique, lithography, etching, asking, and evaporating.

In other words, any techniques (systems) may be employed so long as they provide similar effects.

While this embodiment is described above as a method of manufacturing a single device of surface-emitting laser, the present invention is equally applicable to a method of manufacturing a surface-emitting laser array realized by arranging a plurality of the single device of surface-emitting lasers.

Second Embodiment

Now, the second embodiment will be described below as a method of manufacturing a vertical cavity surface-emitting laser having a concave surface relief structure.

Figure 10A:
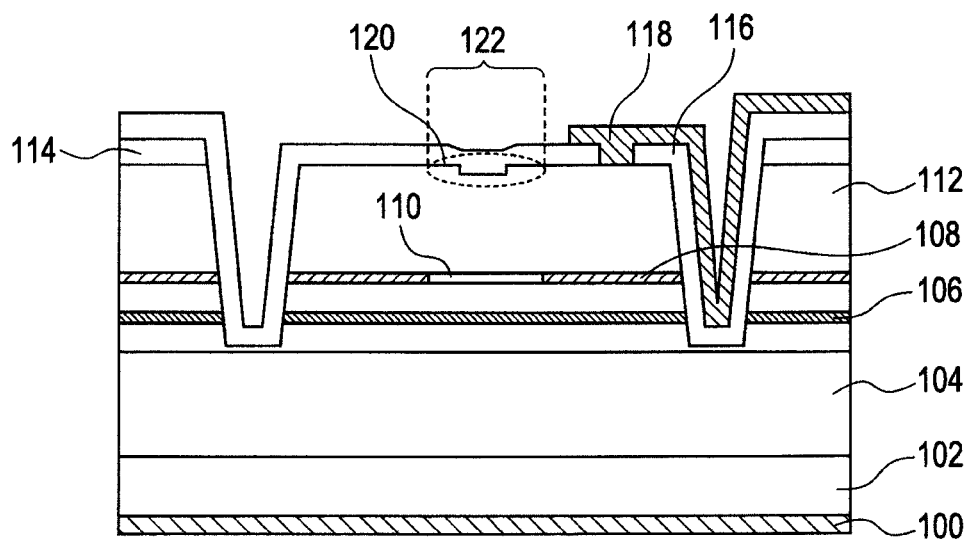
FIG. 10A is a schematic illustration of the configuration of the vertical cavity surface-emitting laser according to a second embodiment of the present invention.
Figure 10B:
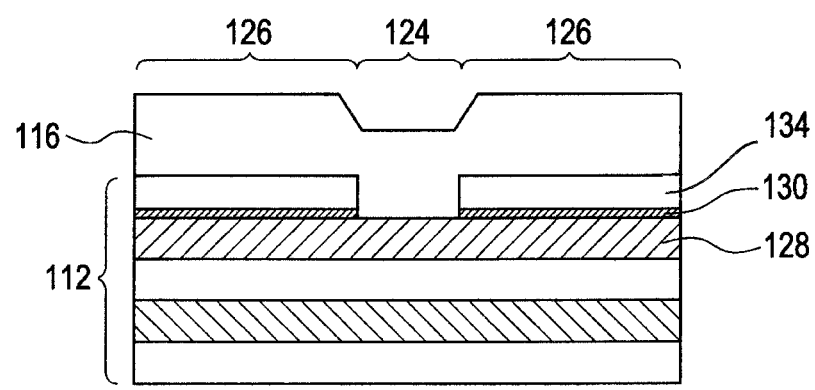
FIG. 10B is another schematic illustration of the configuration of the vertical cavity surface-emitting laser according to the second embodiment of the present invention.

FIGS. 10A and 10B are schematic illustrations of the configuration of the vertical cavity surface-emitting laser of this embodiment. FIG. 10A is a schematic cross-sectional view illustrating the light emission region of the laser, in which 122 denotes the light emission region.

FIG. 10B is an enlarged schematic view of the light emission region 122.

In FIGS. 10A and 10B, the components same as those of the surface-emitting laser of the first embodiment are denoted by the same reference symbols and will not be described repeatedly.

While the high reflectance region 124 of the first embodiment is made to show a convexed profile, the low reflectance region 126 of this embodiment is made show a convexed profile to produce a concave surface relief structure. Now, the method of manufacturing the surface-emitting laser of this embodiment will be described below.

Unlike the manufacturing method of the first embodiment, the layer arrangement of the region forming a surface relief structure includes the following layers, as illustrated in FIG. 10B.

Namely, the layer arrangement includes a p-type $Al_{0.9}Ga_{0.1}As/Al_{0.5}Ga_{0.5}As$-DBR mirror layer 112, a p-type AlGaInP etch stop layer 130 and a p-type GaAs layer 134.

Desirably, the total thickness of the two layers including the p-type AlGaInP etch stop layer 130 and a p-type GaAs layer 134 is made equal to the optical thickness of an odd multiple of the ¼ wavelength (an odd multiple of λ/4n, λ: oscillation wavelength, n: refractive index of the semiconductor layer) in order to most efficiently realize a single transverse mode operation.

The second pattern part in the first resist pattern differs from that of the first embodiment.

All the other steps of this embodiment are same as those of the first embodiment.

Figure 11A:
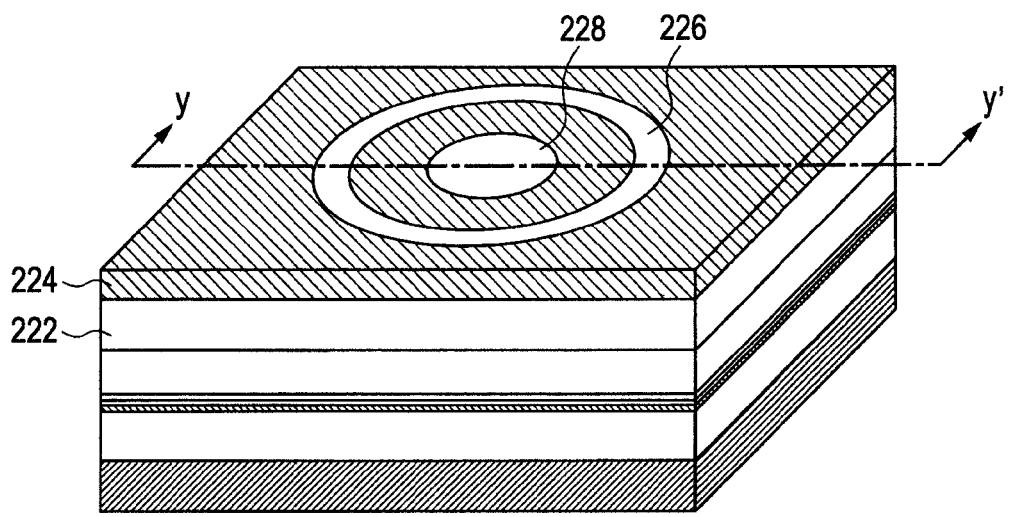
FIG. 11A is a schematic illustration of the first resist film formed by the method of manufacturing the vertical cavity surface-emitting laser according to the second embodiment of the present invention.
Figure 11B:
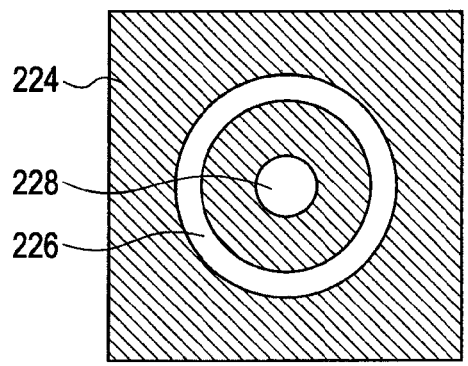
FIG. 11B is another schematic illustration of the first resist film formed by the method of manufacturing the vertical cavity surface-emitting laser according to the second embodiment of the present invention.
Figure 11C:
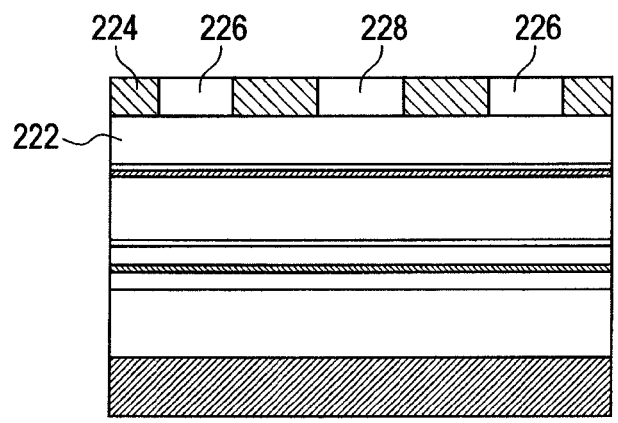
FIG. 11C is still another schematic illustration of the first resist film formed by the method of manufacturing the vertical cavity surface-emitting laser according to the second embodiment of the present invention.

FIGS. 11A to 11C schematically illustrate the first resist pattern formed by the method of manufacturing the surface-emitting laser of the second embodiment for illustrating the difference between the first resist pattern and the first resist pattern of the first embodiment (FIGS. 8A to 8C).

FIG. 11A is a schematic perspective view, FIG. 11B is a schematic plan view, and FIG. 11C is a cross-sectional view taken along line y-y' in the perspective view of FIG. 11A.

In FIGS. 11A to 11C, 222 is the first dielectric film and 224 is the first resist pattern, while 226 is the first pattern and 228 is the second pattern.

As seen from FIGS. 11A to 11C, the first resist pattern 224 is arranged so as to produce apertures of two different patterns (the first pattern 226, the second pattern 228) having the same center axis in common on the first dielectric film 222.

The first pattern 226 is employed to produce a mesa structure, whereas the second pattern 228 is employed to produce a surface relief structure.

While the two patterns that have the same center axis in common and show different profiles illustrated in FIGS. 11A to 11C include a large diameter circular annular pattern and a small diameter circular aperture pattern, the present invention is by no means limited to such an arrangement.

For example, the large annular pattern may be replaced by a square-shaped annular pattern.

Third Embodiment

An optical apparatus including as light source a surface-emitting laser array formed by arranging vertical cavity surface-emitting lasers in array according to the present invention will now be described below as the third embodiment by referring to FIGS. 12A and 12B.

The optical apparatus is an image forming apparatus formed by using a surface-emitting laser array.

Figure 12A:
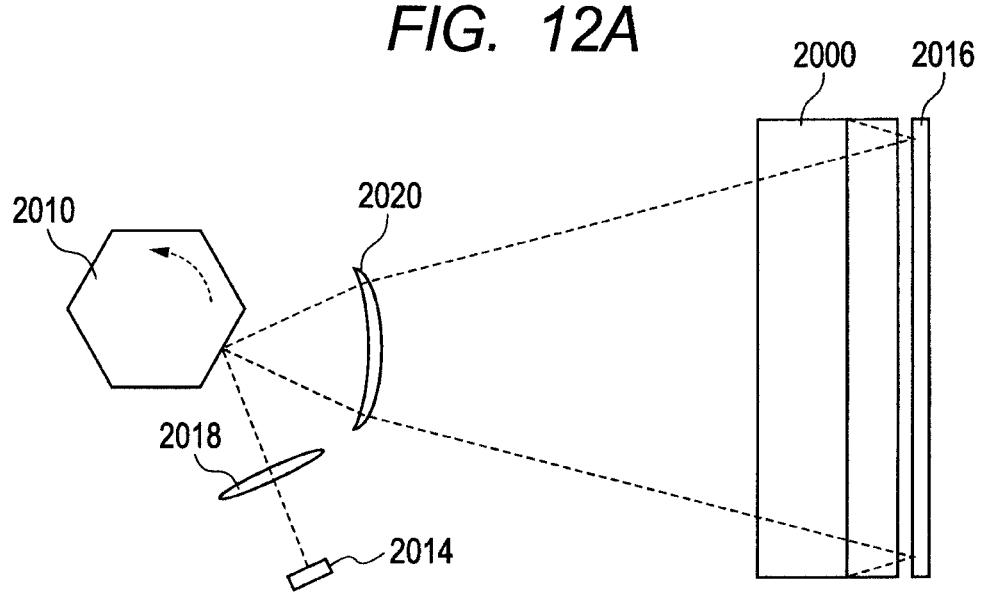
FIG. 12A is a schematic illustration of an electrophotographic type image forming apparatus provided with a laser array manufactured by the method of manufacturing the vertical cavity surface-emitting laser according to a third embodiment of the present invention.
Figure 12B:
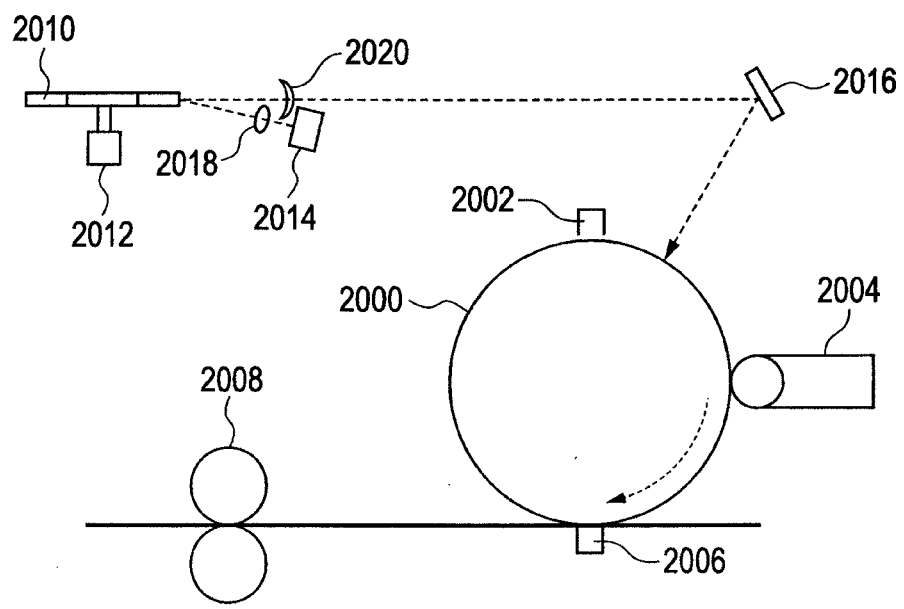
FIG. 12B is another schematic illustration of the electrophotographic type image forming apparatus provided with a laser array manufactured by the method of manufacturing the vertical cavity surface-emitting laser according to the third embodiment of the present invention.

FIG. 12A is a schematic plan view of the image forming apparatus and FIG. 12B is a lateral view of the apparatus.

In FIGS. 12A and 12B, 2000 is a photosensitive drum (photosensitive member), 2002 is a charger, 2004 is a developing unit, 2006 is a transfer charger, 2008 is a fixing unit, 2010 is a rotating polygon mirror, and 2012 is a motor.

FIGS. 12A and 12B additionally illustrate a surface-emitting laser array 2014, a reflecting mirror 2016, a collimator lens 2018 and an f-θ lens 2020.

In this embodiment, the rotating polygon mirror 2010 is driven to rotate by the motor 2012 illustrated in FIG. 12B.

The surface-emitting laser array 2014 operates as light source for recording, which is turned on and turned off according to image signals by means of a laser driver (not illustrated).

A laser light that is optically modulated is irradiated from the surface-emitting laser array 2014 toward the rotating polygon mirror 2010 by way of the collimator lens 2018.

The rotating polygon mirror 2010 is driven to rotate in the sense indicated by the arrow in FIG. 12A and the laser light output from the surface-emitting laser array 2014 is reflected as deflected beam whose angle of emission is continuously shifted by the reflection plane of the rotating polygon mirror 2010 as the rotating polygon mirror 2010 rotates.

The reflected light is corrected for distortions by the f-θ lens 2020 and irradiated onto the photosensitive drum 2000 by way of the reflecting mirror 2016 and scanned in the main scanning direction on the photosensitive drum 2000.

At this time, an image for a plurality of lines that correspond to the surface-emitting laser array 2014 is formed in the main scanning direction of the photosensitive drum 2000 by the reflection of the beam light by way of one plane of the rotating polygon mirror 2010.

The photosensitive drum 2000 is electrically charged in advance by the charger 2002 and sequentially exposed to light as the laser light is scanned to form an electrostatic latent image.

As the photosensitive drum 2000 is driven to rotate in the sense of the arrow illustrated in FIG. 12B so that the formed electrostatic latent image is developed by the developing unit 2004 and the developed visible image is transferred on a sheet of transfer paper by the transfer charger 2006.

The sheet of transfer paper onto which the visible image is transferred is then conveyed to the fixing unit 2008 and discharged to the outside of the image forming apparatus after a fixing operation.

While the optical apparatus is an image forming apparatus in the above description, the present invention is by no means limited to such an arrangement.

For example, an optical apparatus according to the present invention may be a projection display that includes a laser array according to the present invention to be used as light source, an image display member and a light deflector, in which light emitted from the light source is deflected by the light deflector so as to enter the image display member.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-249402, filed Nov. 8, 2010, which is hereby incorporated by reference herein in its entirety.

REFERENCE SIGNS LIST

100: n side electrode
102: substrate
104: lower DBR mirror
106: active layer
108: current confining section (oxidized region)
110: non-oxidized region
112: upper DBR mirror
114: dielectric film
116: insulating film
118: p side electrode
120: surface relief structure
122: light emission region
124: high reflectance region
126: low reflectance region
128: p-type $Al_{0.5}Ga_{0.5}As$ layer
130: p-type AlGaInP etch stop layer
132: p-type $Al_{0.5}Ga_{0.5}As$ layer
134: p-type GaAs contact layer
210: p-type $Al_{0.98}Ga_{0.02}As$ selectively oxidized layer
212: p-type multilayer film
214: p-type AlGaInP etch stop layer
216: p-type $Al_{0.5}Ga_{0.5}As$ layer
218: p-type GaAs contact layer
220: p-type $Al_{0.5}Ga_{0.5}As$ layer
222: first dielectric film
224: first resist pattern
226: first pattern
228: second pattern
230: second dielectric film
232: second resist pattern
234: trench
236: oxidized region
238: non-oxidized region

The invention claimed is:

1. A method of manufacturing a surface-emitting laser having a plurality of semiconductor layers including a lower reflecting mirror, an active layer and an upper reflecting mirror stacked on a substrate, a light emission portion of the upper reflecting mirror being provided with a surface relief structure formed by using a stepped structure, the surface-emitting laser being produced as a mesa structure, comprising:

forming a first dielectric film on a plurality of semiconductor layers;

forming a first pattern for defining a mesa structure and also forming a second pattern for defining a surface relief structure in the first dielectric film in the single step;

removing the surface of the stacked semiconductor layers along the first and second patterns, using the first dielectric film having the first and second patterns formed therein as mask and also a first etch stop layer in the upper reflecting mirror, to form the first and second patterns on the surface of the semiconductor layers;

forming a second dielectric film on the semiconductor layers and on the first dielectric film having the first and second patterns formed therein;

removing a part of the second dielectric film formed on the semiconductor layers along the first pattern formed thereon;

forming the mesa structure from a portion where the second dielectric film has been removed;

forming a current confinement structure after the forming of the mesa structure; and removing the second dielectric film and the first dielectric film on the semiconductor layers and also removing the first etch stop layer along the second pattern in a single step, using the semiconductor layer arranged right under the first etch stop layer as second etch stop layer, after the forming of the current confinement structure.

2. The method of manufacturing a surface-emitting laser according to claim 1, wherein the removing of the dielectric films and the etch stop layer in the single step includes: using the semiconductor layer arranged right under the first dielectric film as a third etch stop layer.

3. The method of manufacturing a surface-emitting laser according to claim 1, further comprising: forming resist on the first dielectric film where the second pattern is formed after the forming of the second dielectric film and before the removing of the second dielectric film.

4. The method of manufacturing a surface-emitting laser according to claim 1, wherein the first etch stop layer comprises of Al, Ga, In and P, or comprises Ga, In and P.

5. The method of manufacturing a surface-emitting laser according to claim 1, wherein the second etch stop layer comprises Al, Ga and As, and an Al composition ratio is not greater than 75%.

6. The method of manufacturing a surface-emitting laser according to claim 1, wherein the third etch stop layer comprises GaAs.

7. The method of manufacturing a surface-emitting laser according to claim 1, wherein the first dielectric film or the second dielectric film comprises at least one of silicon oxide, silicon nitride and silicon oxynitride.

8. The method of manufacturing a surface-emitting laser according to claim 1, wherein an etching rate of the first etch stop layer is more than ten times faster than an etching rate of the semiconductor layer when the surface of the stacked semiconductor layers is removed along the first and second patterns in the step of forming the first and second patterns.

9. The method of manufacturing a surface-emitting laser according to claim 8, wherein the etchant contains phosphoric acid.

10. The method of manufacturing a surface-emitting laser according to claim 1, wherein an etching rate of the second etch stop layer is more than ten times faster than an etching rate of the first and the second dielectric film formed on the semiconductor layers, and the first etch stop layer when the first dielectric film and the second dielectric film on the semiconductor layers are removed and the first etch stop layer is removed along the second pattern in the single process.

11. The method of manufacturing a surface-emitting laser according to claim 1, wherein the mesa structure is formed by dry etching.

12. The method of manufacturing a surface-emitting laser according to claim 1, wherein each of the first pattern and the second pattern has a concentric circular annular opening pattern and the first pattern has a diameter larger than that of the second pattern.

13. The method of manufacturing a surface-emitting laser according to claim 1, wherein the first pattern has a concentric circular annular opening pattern and the second pattern having a smaller diameter than the first pattern has a circular opening pattern.

14. The method of manufacturing a surface-emitting laser according to claim 1, wherein the first pattern has a concentric square annular opening pattern having a longer side length than the second pattern.

15. The method of manufacturing a surface-emitting laser according to claim 1, wherein the first pattern has a concentric square annular opening pattern and the second pattern has a circular opening pattern having a smaller diameter than the first pattern.

16. The method of manufacturing a surface-emitting laser according to claim 1, wherein a central axis of the first pattern is aligned with a central axis of the second pattern.

17. The method of manufacturing a surface-emitting laser according to claim 2, wherein an etching rate of the second and the third etch stop layers are more than ten times faster than an etching rate of the first and the second dielectric film formed on the semiconductor layers and the first etch stop layer when the first dielectric film and the second dielectric film on the semiconductor layers are removed and the first etch stop layer is removed along the second pattern in the single process.

18. The method of manufacturing a surface-emitting laser according to claim 10, wherein the etchant is buffered hydrofluoric acid containing hydrofluoric acid and ammonium fluoride.

19. The method of manufacturing a surface-emitting laser according to claim 1, wherein the first, second and third etch stop layers are of the same conductivity type.

20. A method of manufacturing a surface-emitting laser array, comprising manufacturing a surface-emitting laser array by arranging a plurality of surface-emitting lasers manufactured by the method of manufacturing a surface-emitting laser according to claim 1.

21. A surface-emitting laser having a plurality of semiconductor layers including a lower reflecting mirror, an active layer and an upper reflecting mirror stacked on a substrate, a light emission portion of the upper reflecting mirror being provided with a surface relief structure formed by using a stepped structure, a first layer being stacked under the stepped structure, wherein the first layer directly contacts the surface relief structure, a total thickness of the surface relief structure is made equal to an optical thickness of an odd multiple of $\lambda/4$, where $\lambda$ is an oscillation wavelength, and the first layer has an optical thickness that is N times of $\lambda/2$, where N is a natural number not smaller than 1, and $\lambda$ is the oscillation wavelength.

22. The surface-emitting laser according to claim 21, wherein the surface relief structure is formed by three layers including a lower layer, a middle layer and an upper layer.

23. The surface-emitting laser according to claim 22, wherein the middle layer of the surface relief structure and the first layer comprises Al, Ga and As, and an Al composition ratio is not greater than 75%.

24. The surface-emitting laser according to claim 21, wherein the surface relief structure is formed by two layers including a lower layer and an upper layer.

25. A surface-emitting laser array, wherein surface-emitting lasers according to claim 21 are arranged in an array.

26. An optical apparatus, comprising the surface-emitting laser array according to claim 25 as a light source.

27. An image forming apparatus, comprising the surface-emitting laser according to claim 21 and a photosensitive drum.

* * * * *